(12) United States Patent
Du et al.

(10) Patent No.: US 11,984,760 B2
(45) Date of Patent: May 14, 2024

(54) MODULAR STATIC TRANSFER SWITCHES

(71) Applicant: ABB Schweiz AG, Baden (CH)

(72) Inventors: Yu Du, Pleasanton, CA (US);
Christopher Alan Belcastro,
Mechanicsville, VA (US); Waqas Mahmood Arshad, Cary, NC (US)

(73) Assignee: ABB Schweiz AG, Baden (CH)

( * ) Notice: Subject to any disclaimer, the term of this patent is extended or adjusted under 35 U.S.C. 154(b) by 340 days.

(21) Appl. No.: 17/525,284

(22) Filed: Nov. 12, 2021

(65) Prior Publication Data
US 2023/0155368 A1 May 18, 2023

(51) Int. Cl.
| | |
|---|---|
| *H02J 9/06* | (2006.01) |
| *H01H 47/22* | (2006.01) |
| *H02H 1/00* | (2006.01) |
| *H02H 3/10* | (2006.01) |
| *H02H 5/04* | (2006.01) |
| *H03K 17/687* | (2006.01) |

(52) U.S. Cl.
CPC ............ *H02J 9/068* (2020.01); *H01H 47/22* (2013.01); *H02H 1/0007* (2013.01); *H02H 3/10* (2013.01); *H02H 5/047* (2013.01); *H03K 17/687* (2013.01)

(58) Field of Classification Search
CPC ...... H02J 9/04; H02J 9/06; H02J 9/061; H02J 9/062; H02J 9/068
See application file for complete search history.

(56) References Cited

U.S. PATENT DOCUMENTS

| | | | |
|---|---|---|---|
| 6,465,911 B1 | 10/2002 | Takeda | |
| 7,459,804 B2 | 12/2008 | Marwali | |
| 7,589,438 B2 | 9/2009 | Galm | |
| 8,508,890 B2 | 8/2013 | Zheng | |
| 2006/0006742 A1* | 1/2006 | Galm | H02J 3/007 307/87 |
| 2014/0132080 A1* | 5/2014 | Bush | H03K 17/94 307/130 |

(Continued)

OTHER PUBLICATIONS

International Search Report and Written Opinion for International Application No. PCT/US2022/079617, dated Feb. 17, 2023, 14 pages.

(Continued)

*Primary Examiner* — Jared Fureman
*Assistant Examiner* — Christopher J Clark
(74) *Attorney, Agent, or Firm* — Armstrong Teasdale LLP

(57) ABSTRACT

In one aspect, a modular static transfer switch is provided. The module static transfer switch includes an output configured to couple to a load, a first input configured to couple to a first power source, and a second input configured to couple to a second power source. The modular static transfer switch further includes a plurality of sold-state switch modules each comprising at least one solid-state switch. A first plurality of the solid-state switch modules are coupled in parallel between the first input and the output, each configured to selectively couple the first power source to the output using the at least one solid-state switch. A second plurality of the solid-state switch modules are coupled in parallel between the second input and the output, each configured to selectively couple the second power source to the output using the at least one solid-state switch.

18 Claims, 7 Drawing Sheets

(56) References Cited

U.S. PATENT DOCUMENTS

| | | | |
|---|---|---|---|
| 2015/0035358 A1* | 2/2015 | Linkhart | H02J 3/0073 |
| | | | 307/64 |
| 2018/0331680 A1 | 11/2018 | Wang | |
| 2020/0358309 A1 | 11/2020 | Ferguson | |
| 2021/0249898 A1* | 8/2021 | Schecter | H02J 9/062 |
| 2021/0273440 A1* | 9/2021 | Kang | H01L 21/67 |

OTHER PUBLICATIONS

P. Cheng and Y. Chen, "Design of an Impulse Commutation Bridge for the Solid-State Transfer Switch," IEEE Transactions on Industry Applications, Jul.-Aug. 2008 vol. 44, No. 4, pp. 1249-1258, entire document.

C. Meyer and R.W. De Donker, "Solid-State Circuit Breaker based on Active Thyristor Topologies," IEEE Transactions on Power Electronics, Mar. 2006, vol. 21, No. 2, pp. 450-458, entire document.

* cited by examiner

MODULAR STATIC TRANSFER SWITCHES

BACKGROUND

The field of the disclosure relates to static transfer switches, and more particularly, to static transfer switches with modular transfer circuits.

A static transfer switch is a device that is designed to transfer from supplying a load via a preferred power source to supplying the load via an alternate power source when the power quality of the preferred power source is deemed unacceptable for the load. Conventional static transfer switches use thyristors as the main solid-state switching device, which suffer from some drawbacks, including the inability to interrupt an output current flowing through the thyristors. Therefore, additional protection devices such as fuses and circuit breakers are included in a conventional static transfer switch that utilizes thyristors for overcurrent fault protection. One result of the inability of thyristors to interrupt the output current is that the thyristors are over-specified in their current handling capability in order to survive the high surge currents that can occur during overcurrent faults at the load.

Another problem that arises when using thyristors in conventional static transfer switches is the slow transfer speed when switching the load from being supplied by one power source to another power source. When a power quality issue is detected in the preferred power source and a switchover to the alternate power source is commanded, a zero-crossing load current is needed in order to implement the transfer when the solid-state switches are thyristors. The result of this delay is that the load is subjected to the power quality issues from the preferred power source for up to a half-waveform delay in the current signal before the transfer is made, which can adversely impact the load.

Yet another problem that can arise for conventional static transfer switches relates to redundancy and maintenance downtime when thyristors fail. Thyristors in the conventional static transfer switch may exhibit single point failure modes which require the static transfer switch to be de-energized for service, which can be disruptive to the load supplied by the static transfer switch.

Thus, it is desirable to improve the operation and performance of static transfer switches, and more specifically, improve the operation and performance of static transfer switches that utilize solid-state switching elements.

BRIEF DESCRIPTION

In one aspect, a modular static transfer switch is provided. The module static transfer switch includes an output configured to couple to a load, a first input configured to couple to a first power source, and a second input configured to couple to a second power source. The modular static transfer switch further includes a plurality of sold-state switch modules each comprising at least one solid-state switch. A first plurality of the solid-state switch modules are coupled in parallel between the first input and the output, each solid-state switch module of the first plurality configured to selectively couple the first power source to the output using the at least one solid-state switch. A second plurality of the solid-state switch modules are coupled in parallel between the second input and the output, each solid-state switch module of the second plurality configured to selectively couple the second power source to the output using the at least one solid-state switch.

In another aspect, a method of operating a modular static transfer switch is provided. The modular static transfer switch includes a plurality of solid-state switch modules installed therein, where each of the solid-state switch modules includes at least one solid-state switch. The method includes operating a first plurality of the solid-state switch modules coupled in parallel between a first power source for the modular static transfer switch and a load, where the at least one solid-state switch for each of the first plurality of the solid-state switch modules selectively connects the first power source to the load. The method further includes operating a second plurality of the solid-state switch modules coupled in parallel between a second power source for the modular static transfer switch and the load, where the at least one solid-state switch for each of the second plurality of the solid-state switch modules selectively connects the second power source to the load. The method further includes collaboratively transferring the load between the first power source and the second power source by coordinating operation of the first plurality of the solid-state switch modules with operation of the second plurality of the solid-state switch modules.

In yet another aspect, another modular static transfer switch is provided. The module static transfer switch includes an output configured to couple to a load, a first input configured to couple to a first power source, and a second input configured to couple to a second power source. The modular static transfer switch further includes a plurality of sold-state switch modules each comprising at least one solid-state switch and a controller configured to operate the at least one solid-state switch. A first plurality of the solid-state switch modules are coupled in parallel between the first input and the output, each solid-state switch module of the first plurality configured to selectively couple the first power source to the output using the at least one solid-state switch. A second plurality of the solid-state switch modules are coupled in parallel between the second input and the output, each solid-state switch module of the second plurality configured to selectively couple the second power source to the output using the at least one solid-state switch. Controllers of the first plurality of the solid-state switch modules communicate with controllers of the second plurality of solid-state switch modules to collaboratively transfer the load between the first power source and the second power source.

DRAWINGS

These and other features, aspects, and advantages of the present disclosure will become better understood when the following detailed description is read with reference to the accompanying drawings in which like characters represent like parts throughout the drawings, wherein.

Figure 1:
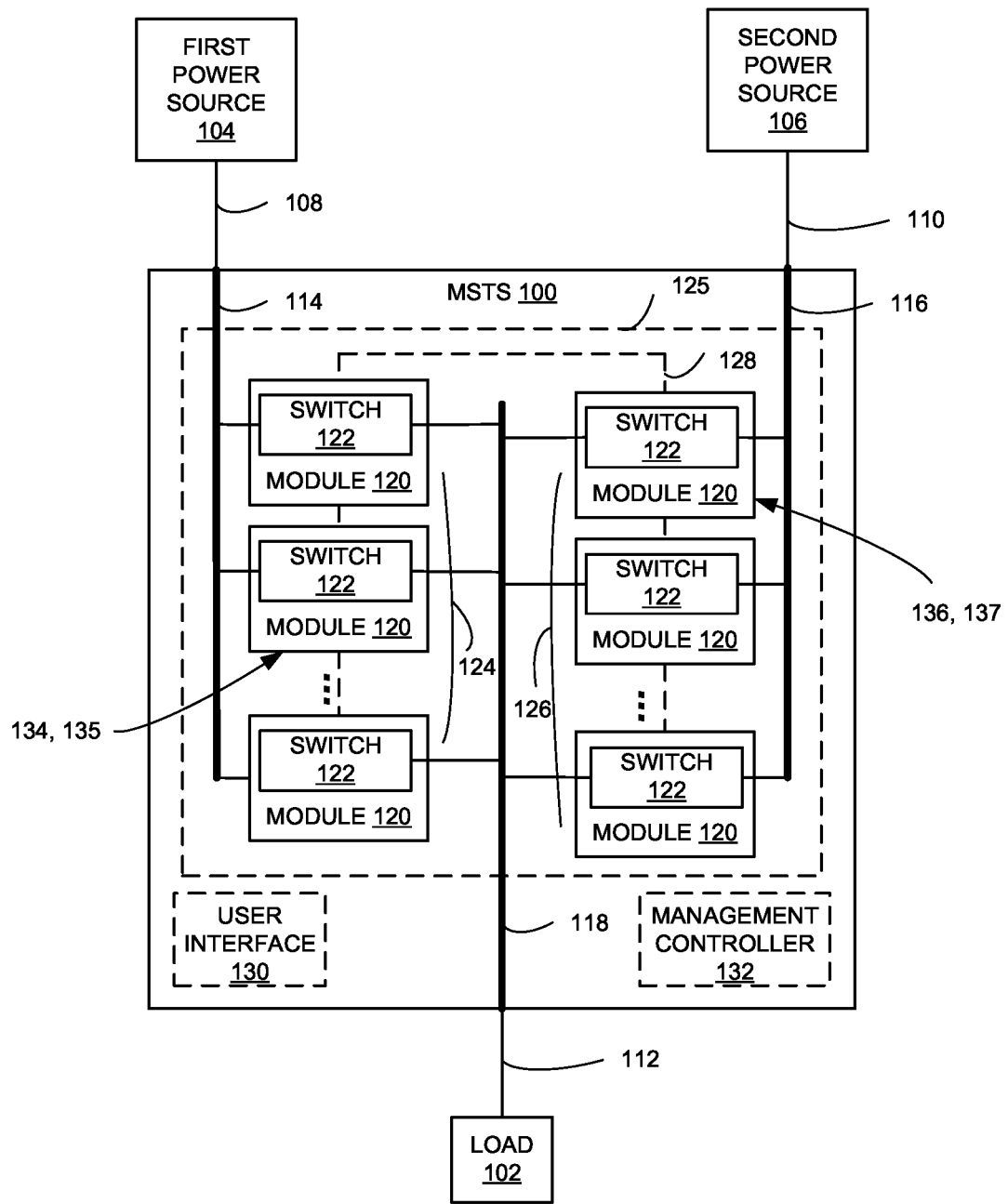
FIG. 1 is a block diagram of a modular static transfer switch in an example embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

As discussed previously, thyristor-based static transfer switches present a number of disadvantages, including problematic overcurrent protection capabilities (due to an inability to terminate a fault current), switching delay due to zero-crossing current transfer requirements, and common single point of failure modes, any of which can result in removing the static transfer switch from operation during maintenance.

In the embodiments described herein, a modular static transfer switch is described which includes a plurality of solid-state switching modules electrically coupled in parallel. The parallel nature of the modules enables a more finely tuned design option whereby the number of modules arranged in parallel for each branch of a multi-branch source-to-load switching scheme can be adjusted based on the desired output current criteria. Further, the modular nature of the modular static transfer switch enables a hot swap capability for individual modules if a module fails, which allows the transfer switch to continue supplying electrical power to the load during maintenance. In addition, the parallel nature of the modules for each source branch in the transfer switch provides redundancy whereby a failed module can be taken offline during operation without adversely impacting the ability of the transfer switch to continue to supply electrical power to the load. Further still, the modules utilize non-thyristor based solid-state switching elements, which can be switched during non-zero current conditions, thereby improving the source transfer time for the transfer switch.

FIG. 1 is a block diagram of a Modular Static Transfer Switch (MSTS) 100 in an example embodiment. In this embodiment, MSTS 100 selectively supplies a load 102 with electrical power from either a first power source 104 or a second power source 106 depending on various criteria. For example, MSTS 100 may supply electrical power to load 102 primarily from first power source 104 unless the electrical power delivered by first power source 104 falls outside of a desired range of values (e.g., first power source 104 has a voltage and/or a harmonic distortion that varies from target values by a threshold amount). If, for example, first power source 104 is either incapable of supplying electrical power to load 102 (e.g., first power source 104 fails or is incapable of supplying electrical power to load 102 at a desired power quality), then MSTS 100 switches load 102 from first power source 104 to second power source 106. In this regard, first power source 104 may operate as a preferred power source for load 102, with second power source 106 operating as a backup or alternate power source for load 102. Although only two power sources are depicted in FIG. 1, MSTS 100 selectively couples load 102 to any number of power sources in other embodiments. Further, although MSTS 100 is depicted as switching single phase power in FIG. 1, MSTS 100 switches 3-phase Alternating Current (AC) power in other embodiments. In 3-phase embodiments, first power source 104, second power source 106 are 3-phase sources, and load 102 is a 3-phase load. In other embodiments, first power source 104 and second power source 106 are Direct Current (DC) sources, and load 102 is a DC load. In other embodiments, first power source 104 and second power source 106 are 3-phase sources, and MSTS provides a plurality of sign-phase loads (e.g., load 102 is a plurality of single-phase loads).

In this embodiment, first power source 104 is electrically coupled to MSTS 100 at a first input 108 and second power source 106 is electrically coupled to MSTS 100 at a second input 110. Load 102 is electrically coupled to an output 112 of MSTS 100. First input 108 is electrically coupled to a first input bus 114 of MSTS 100 and second input 110 is electrically coupled to a second input bus 116 of MSTS 100. Output 112 of MSTS 100 is electrically coupled to an output bus 118 of MSTS 100.

MSTS 100 in this embodiment includes a plurality of solid-state switch modules 120, which operate to selectively couple first power source 104 or second power source 106 to load 102. Modules 120 include any component, system, or device which selectively couples load 102 between first power source 104 and second power source 106. Each of modules 120 in this embodiment includes a one or more solid-state switches 122, which provide a selective electrical path between first power source 104 and load 102 or second power source 106 and load 102. Solid-state switches 122 may include any number of series-parallel combinations of power electronic devices in order to implement the functionality described herein for solid-state switches 122. In some embodiments, solid-state switches 122 include a pair of anti-series connected power semiconductor devices. In these embodiments, solid-state switches 122 are Silicon-Carbide Metal-Oxide-Semiconductor Field-Effect Transistors (SiC MOSFETs).

In this embodiment, modules 120 are segmented into a first plurality of modules 124, which are electrically coupled in parallel between first input bus 114 and output bus 118. Modules 120 are further segmented into a second plurality of modules 126, which are electrically coupled in parallel between second input bus 116 and output bus 118. Although only three modules 120 are depicted for each of first plurality of modules 124 and second plurality of modules 126 in FIG. 1, first plurality of modules 124 and second plurality of modules 126 may include any number of modules 120 electrically coupled in parallel in other embodiments. Further, modules 120 include 3-phase inputs and 3-phase outputs in other embodiments, depending on whether first power source 104, second power source 106, and load 102 are 3-phase sources/loads.

In some embodiments, MSTS 100 further includes a back panel 125, and modules 120 are removably mounted to back panel 125. When removably mounted, modules 120 may be easily replaced during maintenance, even if MSTS 100 remains energized by first power source 104 or second power source 106 and is supplying electrical power to load 102. Back panel 125 includes, in some embodiments, a communication bus 128, which enables modules 120 to communicate with each other. Communication bus 128 includes any component, system, or device that provides wired or wireless communication capability to a user, modules 120, and MSTS 100. During operation, modules 120 may utilize communication bus 128 to coordinate their activities during transfer events. For instance, first plurality of modules 124 and second plurality of modules 126 may communicate with each other utilizing communication bus 128 to collaboratively transfer load 102 between first power source 104 and second power source 106. This will be discussed in more detail below.

In some embodiments, MSTS 100 includes a user interface 130, which includes any component, system, or device which allows a user (not shown) to interact with MSTS 100. Some examples of user interface 130 include keyboards, mice, display devices, etc. User interface 130 may be used by a user to configure modules 120 for operation after installation at MSTS 100. For example, user interface 130 may be used to assign first plurality of modules 124 to a first group IDentifier (ID) and assign second plurality of modules 126 to a second group ID, which enables modules 120 to recognize their electrical configuration within MSTS 100. However, other addressing schemes may be used, such as individual ID assignments for modules 120 with a mechanism to correlate the ID of a module 120 with its electrical configuration within MSTS 100.

MSTS 100 includes, in some embodiments, a management controller 132. Management controller 132 includes any component, system, or device that provides management functions for MSTS 100. In some embodiments, management controller 132 communicates with modules 120 via communication bus 128 to manage transfers of load 102 between first power source 104 and second power source 106. Management controller 132 therefore may perform any functionality described herein for MSTS 100 either alone or in combination with one or more of modules 120 in order to perform the functionality described herein for MSTS 100.

Figure 2:
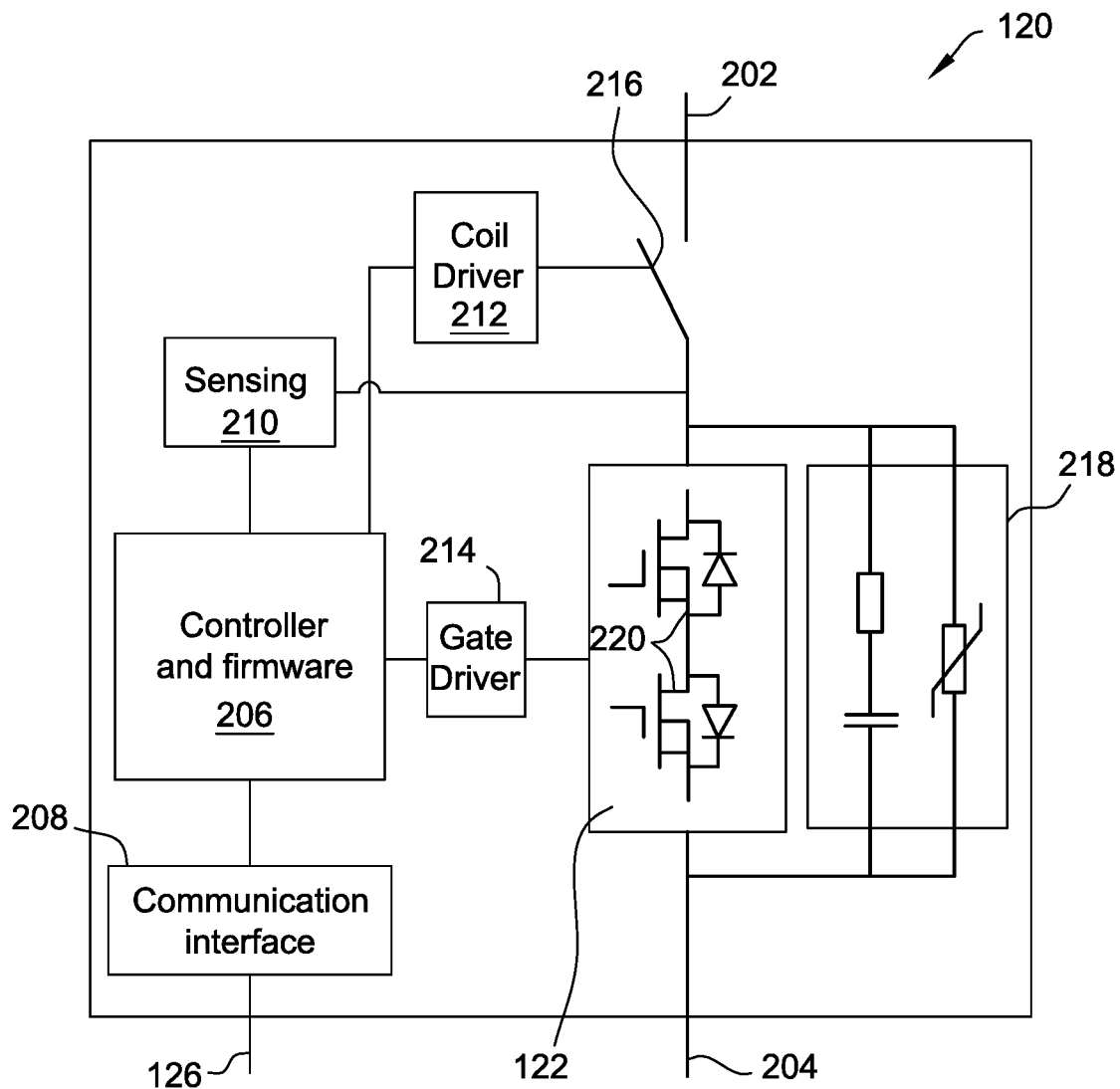
FIG. 2 is a block diagram of a solid-state switching module for the modular static transfer switch of FIG. 1 in an example embodiment.

FIG. 2 is a block diagram of module 120 in an example embodiment. In this embodiment, module 120 includes electrical terminals 202, 204, which are electrically couplable between output bus 118 in MSTS 100 and either first input bus 114 or second input bus 116 depending on whether module 120 is part of first plurality of modules 124 or second plurality of modules 126. Module 120 in this embodiment further includes a controller 206, a communication interface 208, a sensing circuit 210, a coil driver circuit 212, a gate driver circuit 214, a mechanical disconnect 216, and a snubber circuit 218. Controller 206, communication interface 208, sensing circuit 210, coil driver circuit 212, gate driver circuit 214, mechanical disconnect 216, and snubber circuit 218 include any component, system, or device which implements their respective functionality as described herein.

Controller 206 controls the operation of module 120 and interacts with communication interface 208 to send and/or receive information over communication bus 128. Controller 206 utilizes gate driver circuit 214 to control whether solid-state switch 122 is open or closed. Controller 206 also utilizes coil driver circuit 212 to control whether mechanical disconnect 216 is open or closed. Generally, mechanical disconnect 216 provides galvanic isolation for module 120 when mechanical disconnect 216 is open.

Sensing circuit 210 measures information for module 120, including a temperature of module 120, a humidity, a current flowing between terminals 202, 204 (including a current flowing through solid-state switch 122), a voltage at terminals 202, 204 and/or a voltage at solid-state switch 122, a power factor at terminals 202, 204, a harmonic distortion at terminals 202, 204, etc.

Module 120 utilizes snubber circuit 218 during on-off transitions of solid-state switch 122 to clamp voltages transients across solid-state switch 122. The components depicted for snubber circuit 218 are illustrative only, and snubber circuit 218 has different configurations in other embodiments. In this embodiment, solid-state switch 122 is depicted as a pair of anti-series MOSFETs 220. In some embodiments, MOSFETs are arranged in serial and parallel combinations depending on the current capability of module 120.

Although module 120 in this embodiment is depicted as a single-phase device, module 120 is a 3-phase device in other embodiments. In 3-phase embodiments, module 120 includes additional instances of terminals 202, 204, solid-state switch 122, mechanical disconnect 216, and snubber circuits 218 for each phase.

In some embodiments, controller 206 modifies the operation of module 120 based on information measured by sensing circuit 210 by opening and closing mechanical disconnect 216 and/or solid-state switch 122 based on the temperature of module 120, a humidity, the current flowing between terminals 202, 204 (including a current flowing through solid-state switch 122), the voltage at terminals 202, 204 and/or a voltage at solid-state switch 122, the power factor at terminals 202, 204, the harmonic distortion at terminals 202, 204, etc. For example, during current faults, currents higher than a threshold current may flow through solid-state switches 122, which are sensed by controller 206 and cause controller 206 to open solid-state switches 122 and/or mechanical disconnect 216. Such fault currents may further be detected by comparing the measured currents to a pre-determined time-current curve.

In another example, a temperature of module 120 higher than a threshold temperature may cause controller 206 to open solid-state switches 122 and/or mechanical disconnect 216. In another embodiment, the voltage at terminals 202, 204 and/or a voltage at solid-state switch 122, the power factor at terminals 202, 204, the harmonic distortion at terminals 202, 204, a humidity, etc., may cause controller 206 to initiate a transfer between first power source 104 and second power source 106. In other embodiments, any of the prior factors may trigger controller 206 to communicate this information to management controller 132, which may take any further action deemed appropriate in order to rectify non-standard operating conditions at MSTS 100.

Figure 3:
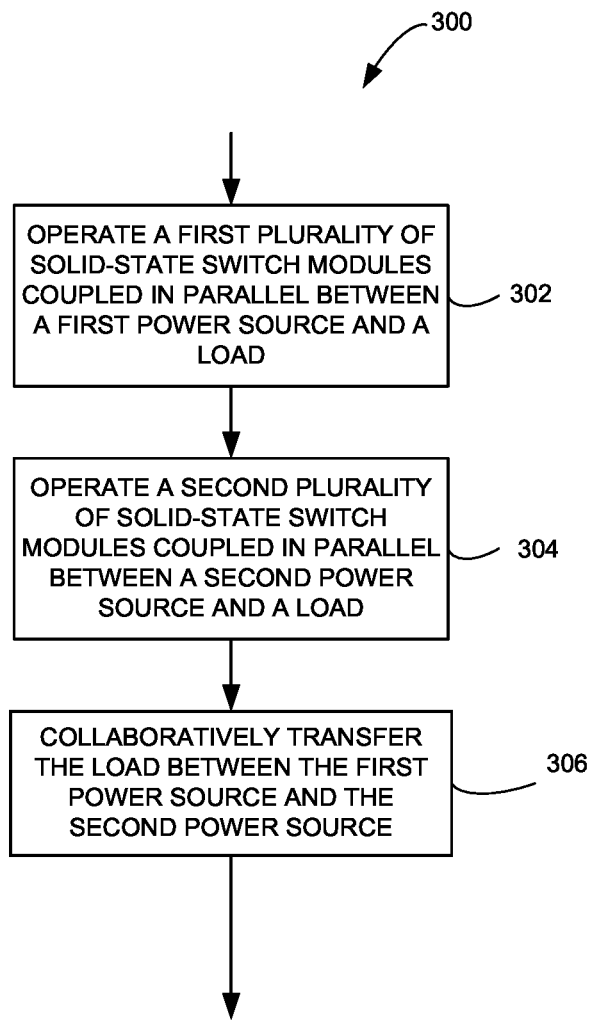
FIG. 3 is a flow chart of a method of operating the modular static transfer switch of FIG. 1 in an example embodiment.

FIG. 3 is a flow chart of a method 300 of operating a modular static transfer switch in an example embodiment. Method 300 will be discussed with respect to MSTS 100, although method 300 may be performed by other systems or devices, not shown. The methods described herein are not all inclusive and may include other steps not shown. Further, the steps of the methods described herein may be performed in a different order.

During operation, first plurality of modules 124 operate to selectively connect first power source 104 to load 102 (see step 302) and second plurality 126 of modules 120 operate to selectively connect second power source 106 to load 102 (see step 304).

First, consider that MSTS 100 is initially supplying electrical power to load 102 from first power source 104. If an issue is detected with first power source 104, MSTS 100 ensures the proper operation of load 102 by transferring load 102 from first power source 104 to second power source 106 (see step 306). To do so, solid-state switches 122 in first plurality of modules 124 open to start the transfer, and after a time delay to ensure that first power source 104 is disconnected from load 102, solid-state switches 122 in second plurality of modules 126 are closed, which completes the transfer. This activity can occur in a number of different ways. In one embodiment, management controller 132 generates instructions that direct controllers 206 of modules 120 to perform this activity. In another embodiment, controllers 206 of modules 120 communicate with each other to perform this activity. For instance, controllers 206 of first plurality of modules 124 coordinate with each other to open their solid-state switches 122 to start the transfer, and controllers 206 of second plurality of modules 126 coordinate with each other to close their solid-state switches 122 to complete the transfer. In addition, controllers 206 of modules 120 communicate with each other to implement the time delay to ensure that first power source 104 is disconnect from load 102 prior to connecting second power source 106 to load 102.

Next, consider that MSTS 100 is initially supplying electrical power to load 102 from second power source 106. If an issue is detected with second power source 106, MSTS 100 ensures the proper operation of load 102 by transferring load 102 from second power source 106 to first power source 104 (see step 306). To do so, solid-state switches 122 in second plurality of modules 126 open to start the transfer, and after a time delay to ensure that second power source 106 is disconnected from load 102, solid-state switches 122 in first plurality of modules 124 are closed, which completes the transfer. This activity can occur in a number of different ways. In one embodiment, management controller 132 generates instructions that direct controllers 206 of modules 120 to perform this activity. In another embodiment, controllers 206 of modules 120 communicate with each other to perform this activity. For instance, controllers 206 of second plurality of modules 126 coordinate with each other to open their solid-state switches 122, and controllers 206 of first plurality of modules 124 coordinate with each other to close their solid-state switches 122. In addition, controllers 206 of modules 120 communicate with each other to implement the time delay to ensure that second power source 106 is disconnect from load 102 prior to connecting first power source 104 to load 102.

Figure 4:
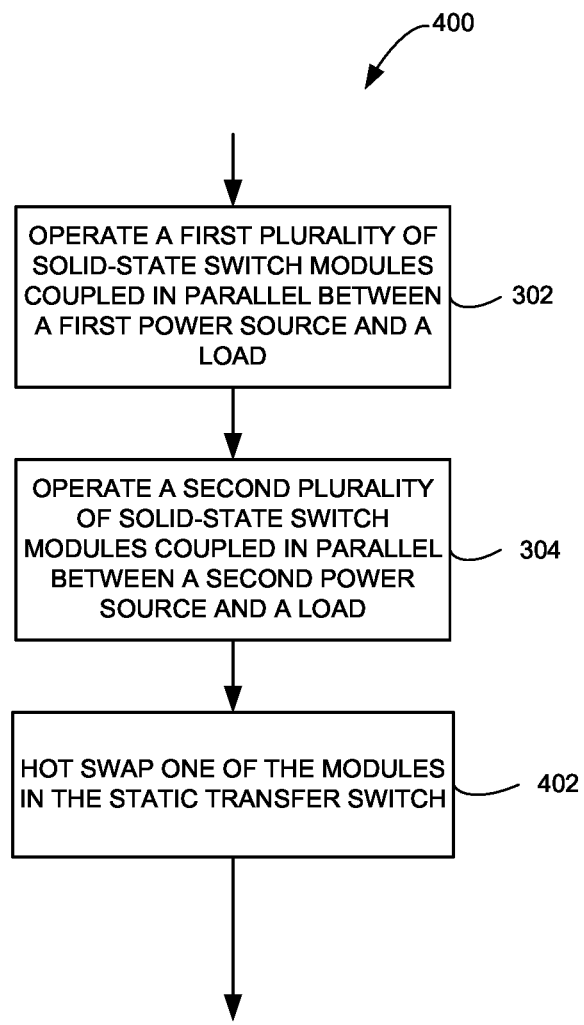
FIG. 4 is a flow chart of a method of servicing the modular static transfer switch of FIG. 1 in an example embodiment.
Figure 5:
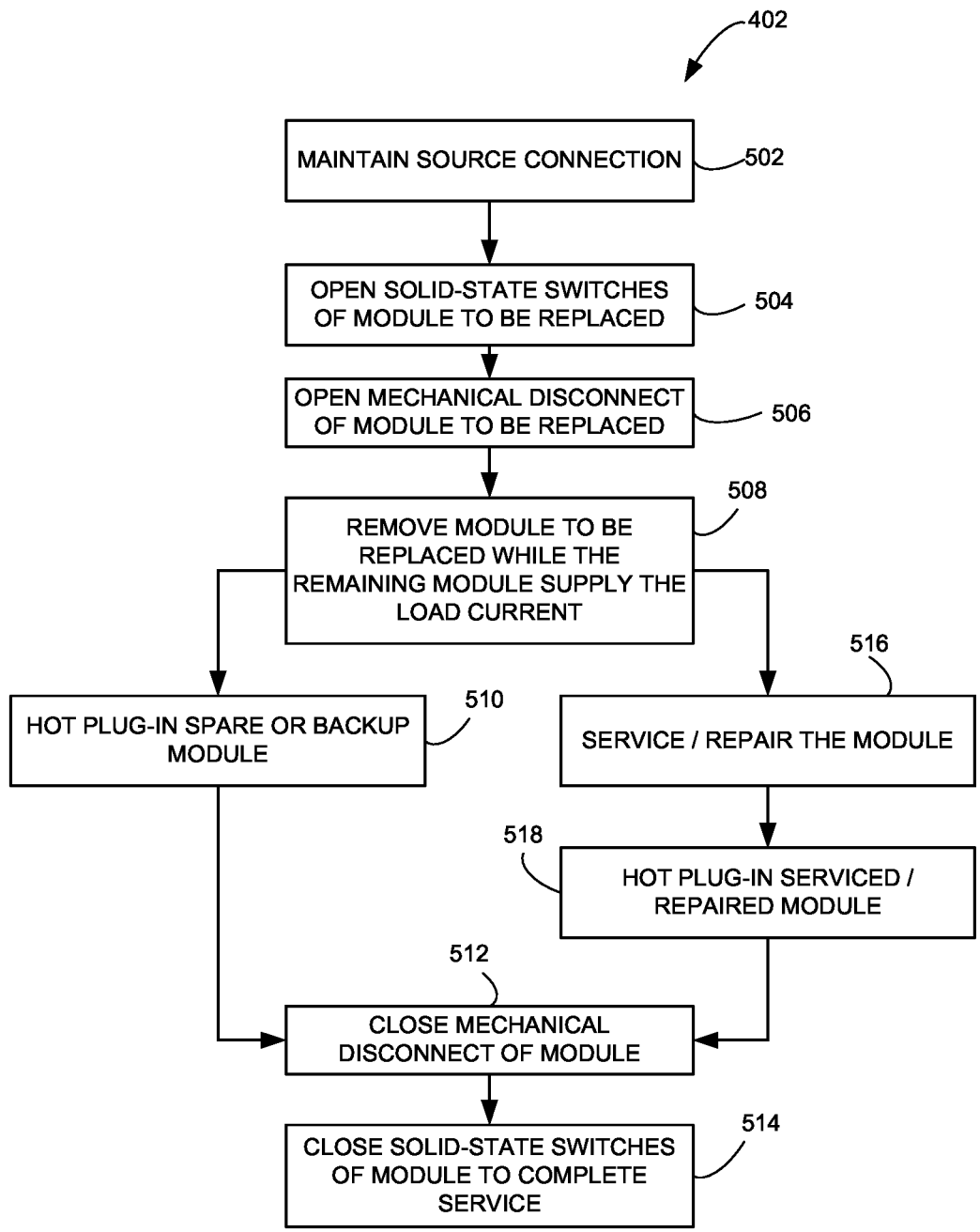
FIG. 5 depicts additional details of the method of FIG. 4 in an example embodiment.

FIG. 4 is a flow chart of a method 400 of servicing a modular static transfer switch in an example embodiment, and FIG. 5 depicts additional details of method 400. Method 400 will be discussed with respect to MSTS 100, although method 400 may be performed by other systems or devices, not shown.

During operation, first plurality of modules 124 operate to selectively connect first power source 104 to load 102 (see step 302 of FIG. 4) and second plurality of modules 126 operate to selectively connect second power source 106 to load 102 (see step 304 of FIG. 4). First, consider that MSTS 100 is currently supplying electrical power to load 102 from first power source 104, and an issue is detected with module 134 (see FIG. 1). For example, module 134 may require service, repair, or may have failed. When module 134 fails, the remaining modules in first plurality of modules 124 continue to supply electrical power to load 102 from first power source 104, by, for example, each supplying a larger portion of the current for load 102 due to the loss of module 134. Module 134 is hot-swapped in MSTS 100 without disconnecting first power source 104 from load 102 (see step 402). To do so, first power source 104 remains connected to load 102 (see step 502 of FIG. 5). In order to remove module 134 in MSTS 100 (see FIG. 2), solid-state switch 122 of module 134 is opened (see step 504 of FIG. 5), followed by opening mechanical disconnect 216 (see step 506 of FIG. 5 and FIG. 2) of module 134, which isolates module 134 from MSTS 100. Module 134 is removed, and the remaining modules of first plurality of modules 124 continue to supply the electrical power to load 102 from first power source 104 (see step 508). If a spare/backup module 135 (see FIG. 1) is available, spare/backup module 135 is hot plugged into MSTS 100 (see step 510). Mechanical disconnect 216 of spare/backup module 135 is closed (see step 512), and solid-state switch 122 of spare/backup module 135 is closed (see step 514), which electrically couples spare/backup module 135 to MSTS 100. Spare/backup module 135 begins to supply load 102 with a portion of the electrical current from first power source 104. In another embodiment, module 134 is serviced/repaired after removal (see step 516) and is hot-plugged into MSTS 100 (see step 518). Mechanical disconnect 216 of module 134 is closed (see step 512), and solid-state switch 122 of module 134 is closed (see step 514), which electrically couples module 134 to MSTS 100. Module 134 begins to supply load 102 with a portion of the electrical current from first power source 104.

Next, consider that MSTS 100 is currently supplying electrical power to load 102 from second power source 106, and an issue is detected with module 136 (see FIG. 1). For example, module 136 may require service, repair, or may have failed. When module 136 fails, the remaining modules in second plurality of modules 126 continue to supply electrical power to load 102 from second power source 106, by, for example, each supplying a larger portion of the current for load 102 due to the loss of module 136. Module 136 is hot-swapped in MSTS 100 without disconnecting second power source 106 from load 102 (see step 402). To do so, second power source 106 remains connected to load 102 (see step 502 of FIG. 5). In order to remove module 136 in MSTS 100 (see FIG. 1), solid-state switch 122 of module 136 is opened (see step 504 of FIG. 5), followed by opening mechanical disconnect 216 (see step 506 of FIG. 5 and FIG. 2) of module 136, which isolates module 136 from MSTS 100. Module 136 is removed, and the remaining modules of second plurality of modules 126 continue to supply the electrical power to load 102 from second power source 106 (see step 508). If a spare/backup module 137 (see FIG. 1) is available, spare/backup module 137 is hot plugged into MSTS 100 (see step 510). Mechanical disconnect 216 of spare/backup module 137 is closed (see step 512), and solid-state switch 122 of spare/backup module 137 is closed (see step 512), which electrically couples spare/backup module 137 to MSTS 100. Spare/backup module 137 begins to supply load 102 with a portion of the electrical current from second power source 106. In another embodiment, module 136 is serviced/repaired after removal (see step 516) and is hot-plugged into MSTS 100 (see step 518). Mechanical disconnect 216 of module 136 is closed (see step 512), and solid-state switch 122 of module 136 is closed (see step 514), which electrically couples module 136 to MSTS 100. Module 136 begins to supply load 102 with a portion of the electrical current from second power source 106.

Figure 6:
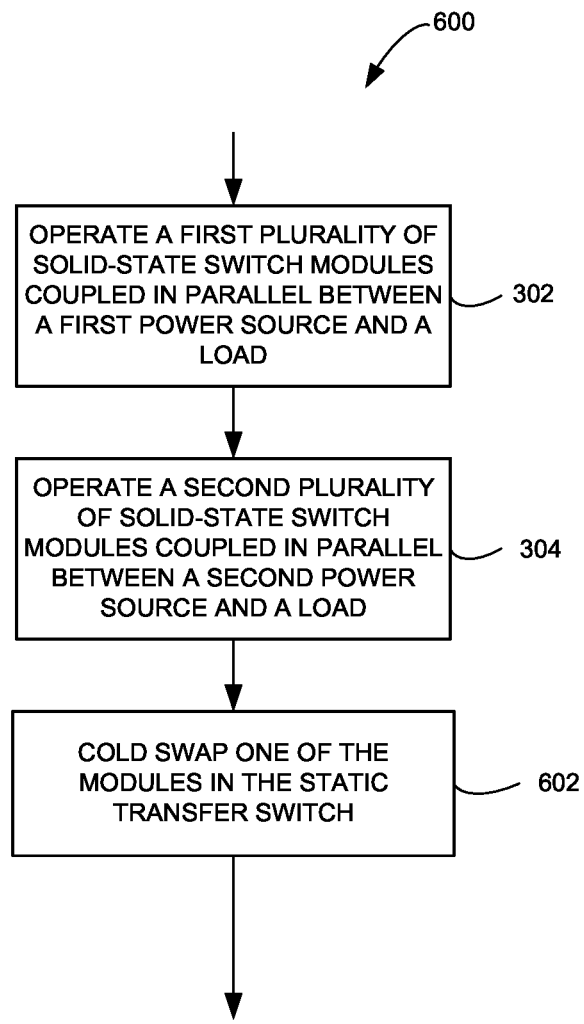
FIG. 6 is a flow chart of another method of servicing the modular static transfer switch of FIG. 1 in an example embodiment.
Figure 7:
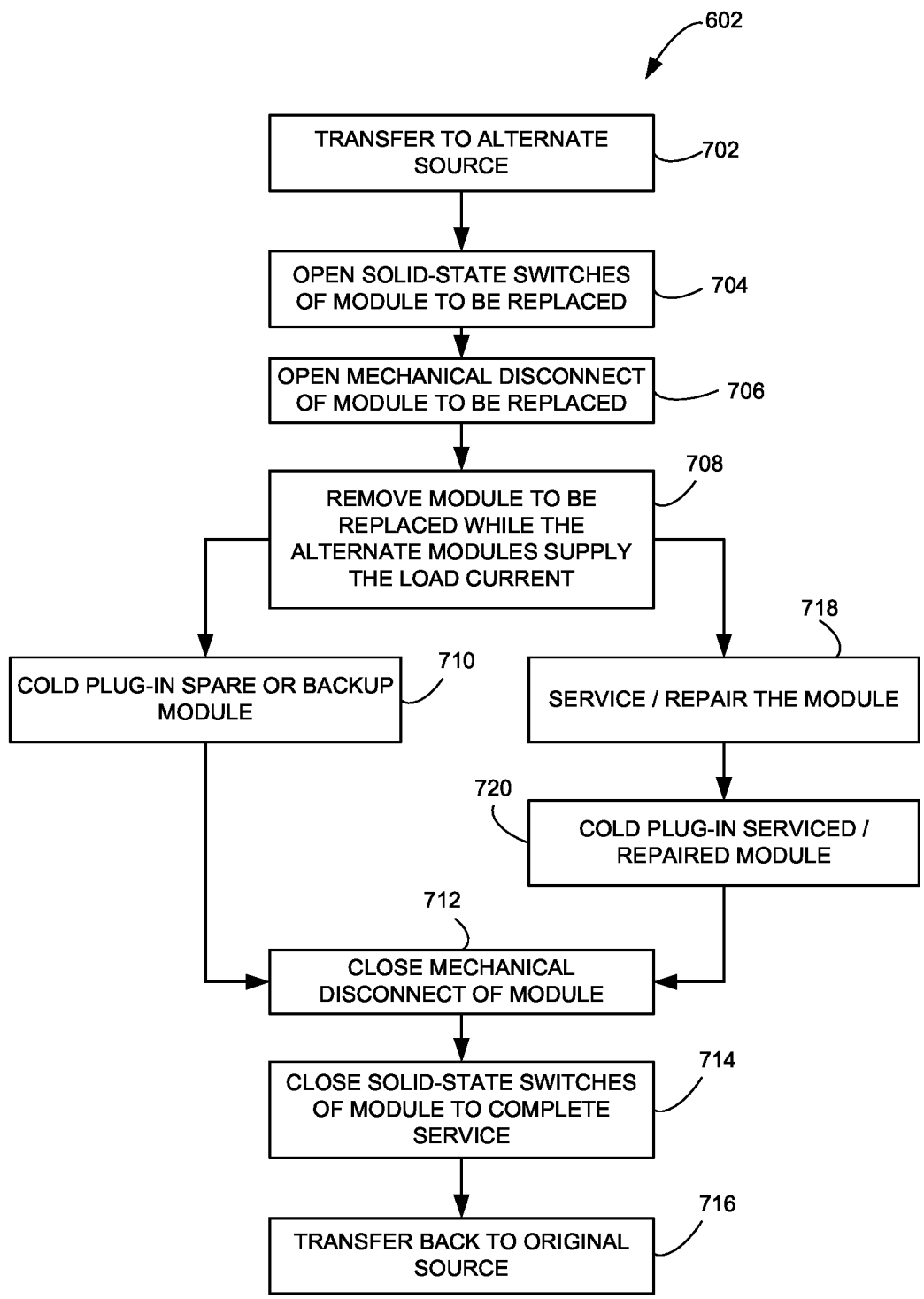
FIG. 7 depicts additional details of the method of FIG. 6 in an example embodiment.

In other embodiments, module 134 or module 136 are serviced by transferring load 102 between first power source 104 and second power source 106. FIG. 6 is a flow chart of another method 600 of servicing a modular static transfer switch in an example embodiment, and FIG. 7 depicts additional details of method 600. Method 600 will be discussed with respect to MSTS 100, although method 600 may be performed by other systems or devices, not shown.

During operation, first plurality of modules 124 operate to selectively connect first power source 104 to load 102 (see step 302 of FIG. 6) and second plurality of modules 126 operate to selectively connect second power source 106 to load 102 (see step 304 of FIG. 6). First, consider that MSTS 100 is currently supplying electrical power to load 102 from first power source 104, and an issue is detected with module 134 (see FIG. 1). For example, module 134 may require service, repair, or may have failed. When module 134 fails, module 134 is cold-swapped in MSTS 100 after transferring load 102 to second power source 106 (see step 602). To do so, load 102 is transferred to second power source 106 (see step 702 of FIG. 7), which de-energizes module 134. In order to remove module 134 in MSTS 100 (see FIG. 2), solid-state switch 122 of module 134 is opened (see step 704 of FIG. 7), followed by opening mechanical disconnect 216 (see step 706 of FIG. 7 and FIG. 2) of module 134, which isolates module 134 from MSTS 100. Module 134 is removed, and second plurality of modules 126 continue to supply the electrical power to load 102 from second power source 106 (see step 708). If a spare/backup module 135 (see FIG. 1) is available, spare/backup module 135 is cold-plugged into MSTS 100 (see step 710). Mechanical disconnect 216 of spare/backup module 135 is closed (see step 712), and solid-state switch 122 of spare/backup module 135 is closed (see step 714), which electrically couples spare/backup module 135 to MSTS 100. Load 102 is transferred back to first power source 104 (see step 716), and spare/backup module 135 begins to supply load 102 with a portion of the electrical current from first power source 104. In another embodiment, module 134 is serviced/repaired after removal (see step 716) and is cold-plugged into MSTS 100 (see step 718). Mechanical disconnect 216 of module 134 is closed (see step 712), and solid-state switch 122 of module 134 is closed (see step 714), which electrically couples module 134 to MSTS 100. Load 102 is transferred back to first power source 104 (see step 716), and module 134 begins to supply load 102 with a portion of the electrical current from first power source 104.

Next, consider that MSTS 100 is currently supplying electrical power to load 102 from second power source 106, and an issue is detected with module 136 (see FIG. 1). For example, module 136 may require service, repair, or may have failed. When module 136 fails, module 136 is cold-swapped in MSTS 100 after transferring load 102 to first power source 104 (see step 602). To do so, load 102 is transferred to first power source 104 (see step 702 of FIG. 7), which de-energizes module 136. In order to remove module 136 in MSTS 100 (see FIG. 2), solid-state switch 122 of module 136 is opened (see step 704 of FIG. 7), followed by opening mechanical disconnect 216 (see step 706 of FIG. 7 and FIG. 2) of module 136, which isolates module 136 from MSTS 100. Module 136 is removed, and first plurality of modules 124 continue to supply the electrical power to load 102 from first power source 104 (see step 708). If a spare/backup module 137 (see FIG. 1) is available, spare/backup module 137 is cold-plugged into MSTS 100 (see step 710). Mechanical disconnect 216 of spare/backup module 137 is closed (see step 712), and solid-state switch 122 of spare/backup module 137 is closed (see step 714), which electrically couples spare/backup module 137 to MSTS 100. Load 102 is transferred back to second power source 106 (see step 716), and spare/backup module 137 begins to supply load 102 with a portion of the electrical current from second power source 106. In another embodiment, module 136 is serviced/repaired after removal (see step 718) and is cold-plugged into MSTS 100 (see step 720). Mechanical disconnect 216 of module 136 is closed (see step 712), and solid-state switch 122 of module 136 is closed (see step 714), which electrically couples module 136 to MSTS 100. Load 102 is transferred back to second power source 106 (see step 716), and module 136 begins to supply load 102 with a portion of the electrical current from second power source 106.

Any of the prior load 102 transfers between first power source 104 and second power source 106 may be performed intelligently in order to minimize the disruption to load 102, such as by minimizing the phase angle between first power source 104 and second power source 106 during the transfer, by, for example, modifying the delay time between opening and closing solid-state switches 122 during the transfer. In one embodiment, in order to minimize the phase angle difference between first power source 104 and second power source 106 when transferring load 102 from first power source 104 to second power source 106, the delay time after opening solid-state switches 122 in first plurality of modules 124 is modified, which modifies when solid-state switches 122 in second plurality of modules 126 are closed, which minimizes the disruption to load 102. In another embodiment, in order to minimize the phase angle difference between first power source 104 and second power source 106 when transferring load 102 from second power source 106 to first power source 104, the delay time after opening solid-state switches 122 in second plurality of modules 126 is modified, which modifies when solid-state switches 122 in first plurality of modules 124 are closed, which minimizes the disruption to load 102.

An example technical effect of the apparatus and methods described herein includes one or more of: (a) minimizing disruptions to a load even with single-point module failures; (b) providing hot-swap capability for repair or replacing modules; and (c) improving the transfer time between different power sources using solid-state switches that can switch in a non-zero current scenario.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A modular static transfer switch comprising:
an output configured to couple to a load;
a first input configured to couple to a first power source;
a second input configured to couple to a second power source;
a plurality of solid-state switch modules each comprising at least one solid-state switch,
wherein a first plurality of the solid-state switch modules are coupled in parallel between the first input and the output, each of the first plurality of the solid-state switch modules configured to selectively couple the first power source to the output using the at least one solid-state switch, and
wherein a second plurality of the solid-state switch modules are coupled in parallel between the second input and the output, each of the second plurality of the solid-state switch modules configured to selectively couple the second power source to the output using the at least one solid-state switch; and
a back panel electrically coupling the first plurality of the solid-state switch modules with the first input and the output, and electrically coupling the second plurality of the solid-state switch modules with the second input and the output,
wherein each of the first plurality of the solid-state switch modules and each of the second plurality of the solid-state switch modules are removably mounted to the back panel.

2. The modular static transfer switch of claim 1, wherein the back panel further comprises a communication bus,
wherein each of the solid-state switch modules further comprises a controller configured to operate the at least one solid-state switch, and
wherein controllers of the first plurality of the solid-state switch modules communicate with controllers of the second plurality of the solid-state switch modules utilizing the communication bus to collaboratively transfer the load between the first power source and the second power source.

3. The modular static transfer switch of claim 2, wherein:
to collaboratively transfer the load from the first power source to the second power source, the controllers are further configured to:
open the at least one solid-state switch for each of the first plurality of the solid-state switch modules;
wait for a delay time after opening the at least one solid-state switch for each of the first plurality of the solid-state switch modules; and
close the at least one solid-state switch for each of the second plurality of the solid-state switch modules after the delay time.

4. The modular static transfer switch of claim 2, wherein:
each of the solid-state switch modules further comprises:
a mechanical disconnect in series with the at least one solid-state switch;
a sensing circuit configured to:
measure a voltage of the at least one solid-state switch;
measure a current of the at least one solid-state switch;
measure a temperature; and
measure a humidity;
a gate driver circuit configured to open and close the at least one solid-state switch; and
a coil driver circuit configured to open and close the mechanical disconnect,
wherein the controller is further configured to:
receive measurements of the voltage, the current, and the temperature from the sensing circuit;
determine whether to open or close each of the at least one solid-state switch and the mechanical disconnect based on the measurements; and
operate at least one of (i) the gate driver circuit to open or close the at least one solid-state switch and (ii) the coil driver circuit to open or close the mechanical disconnect based on the determination.

5. The modular static transfer switch of claim 4, wherein:
the controller is further configured to:
determine whether a fault condition has occurred based on the measurements of the current received from the sensing circuit for the at least one solid-state switch; and
operate the gate driver circuit to open the at least one solid-state switch in response to determining that the fault condition has occurred.

6. The modular static transfer switch of claim 5, wherein:
the controller is further configured to operate the gate driver circuit to open the at least one solid-state switch by comparing the measurements of current received from the sensing circuit for the at least one solid-state switch to a pre-programmed time-current curve.

7. The modular static transfer switch of claim 1, wherein the at least one solid-state switch comprises a pair of anti-series connected power semiconductor switches.

8. The modular static transfer switch of claim 7, wherein:
the pair of anti-series connected power semiconductor switches comprises Silicon-Carbide Metal-Oxide-Semiconductor Field-Effect Transistors (SiC MOSFETs).

9. The modular static transfer switch of claim 1, wherein the solid-state switch modules further comprise:
a mechanical disconnect in series with the at least one solid-state switch that is configured to selectively open and provide galvanic isolation.

10. A method of operating a modular static transfer switch including a communication bus and a plurality of solid-state switch modules installed therein, each of the solid-state switch modules including at least one solid-state switch and a controller configured to operate the at least one solid-state switch, the method comprising:
operating a first plurality of the solid-state switch modules coupled in parallel between a first power source for the modular static transfer switch and a load, wherein the at least one solid-state switch for each of the first plurality of the solid-state switch modules selectively connects the first power source to the load;
operating a second plurality of the solid-state switch modules coupled in parallel between a second power source for the modular static transfer switch and the load, wherein the at least one solid-state switch for each of the second plurality of the solid-state switch modules selectively connects the second power source to the load; and
collaboratively transferring the load between the first power source and the second power source by communicating between controllers of the first plurality of the solid-state switch modules and controllers of the second plurality of the solid-state switch modules utilizing the communication bus to coordinate an operation of the first plurality of the solid-state switch modules with an operation of the second plurality of the solid-state switch modules.

11. The method of claim 10, wherein:
the load is electrically powered by the first power source, and
collaboratively transferring the load further comprises:
opening the at least one solid-state switch for each of the first plurality of the solid-state switch modules to disconnect the load from the first power source;
waiting for a delay time after opening the at least one solid-state switch for each of the first plurality of the solid-state switch modules; and
closing the at least one solid-state switch for each of the second plurality of the solid-state switch modules after the delay time to connect the load to the second power source.

12. The method of claim 10, wherein:
each of the solid-state switch modules further comprises a mechanical disconnect in series with the at least one solid-state switch, and
the method further comprises:
measuring a voltage of the at least one solid-state switch for each of the first plurality of the solid-state switch modules and the second plurality of the solid-state switch modules;
measuring a current of the at least one solid-state switch for each of the first plurality of the solid-state switch modules and the second plurality of the solid-state switch modules;
measuring a temperature of each of the first plurality of the solid-state switch modules and the second plurality of the solid-state switch modules;
measuring a humidity of each of the first plurality of the solid-state switch modules and the second plurality of the solid-state switch modules; and
determining whether to open or close the at least one solid-state switch for each of the first plurality of the solid-state switch modules and the second plurality of the solid-state switch modules based on the measurements.

13. The method of claim 12, further comprising:
determining whether a fault condition has occurred at a solid-state switch module based on the current measured for the solid-state switch module; and
opening at least one of the mechanical disconnect and the at least one solid-state switch for the solid-state switch module based on the determination.

14. The method of claim 13, further comprising:
comparing the current measured for the solid-state switch module to a pre-programmed time-current curve; and
opening at least one of the mechanical disconnect and the at least one solid-state switch for the solid-state switch module based on the comparison.

15. The method of claim 10, further comprising:
identifying a solid-state switch module of the first plurality of the solid-state switch modules for removal, wherein the first plurality of the solid-state switch modules electrically couple the first power source with the load;
opening the at least one solid-state switch for the identified solid-state switch module; and
replacing the identified solid-state switch module while remaining solid-state switch modules of the first plurality of the solid-state switch modules continue to electrically couple the first power source with the load.

16. A modular static transfer switch comprising:
an output configured to couple to a load;
a first input configured to couple to a first power source;
a second input configured to couple to a second power source; and
a plurality of solid-state switch modules each comprising at least one solid-state switch and a controller configured to operate the at least one solid-state switch,
wherein a first plurality of the solid-state switch modules are coupled in parallel between the first input and the output, each of the first plurality of the solid-state switch modules configured to selectively couple the first power source to the output using the at least one solid-state switch,
wherein a second plurality of the solid-state switch modules are coupled in parallel between the second input and the output, each of the second plurality of the solid-state switch modules configured to selectively couple the second power source to the output using the at least one solid-state switch, and
wherein controllers of the first plurality of the solid-state switch modules communicate with controllers of the second plurality of the solid-state switch modules to collaboratively transfer the load between the first power source and the second power source.

17. The modular static transfer switch of claim 16, wherein:
the controllers are further configured to collaboratively transfer the load from the first power source to the second power source by:
opening the at least one solid-state switch for each of the first plurality of the solid-state switch modules;
waiting for a delay time after opening the at least one solid-state switch for each of the first plurality of the solid-state switch modules; and
closing the at least one solid-state switch for each of the second plurality of the solid-state switch modules after the delay time.

18. The modular static transfer switch of claim 16, wherein:
each of the solid-state switch modules further comprises:
a mechanical disconnect in series with the at least one solid-state switch;
a sensing circuit configured to:
measure a voltage of the at least one solid-state switch;
measure a current of the at least one solid-state switch;
measure a temperature; and
measure a humidity;
a gate driver circuit configured to open and close the at least one solid-state switch; and
a coil driver circuit configured to open and close the mechanical disconnect,
wherein the controller is further configured to:
receive measurements of the voltage, the current, and the temperature from the sensing circuit;
determine whether to open or close each of the at least one solid-state switch and the mechanical disconnect based on the measurements; and
operate at least one of the gate driver circuit to open or close the at least one solid-state switch and the coil driver circuit to open or close the mechanical disconnect based on the determination.

\* \* \* \* \*